(12) United States Patent
Peethala et al.

(10) Patent No.: US 11,637,036 B2
(45) Date of Patent: Apr. 25, 2023

(54) PLANARIZATION STOP REGION FOR USE WITH LOW PATTERN DENSITY INTERCONNECTS

(71) Applicant: International Business Machines Corporation, Armonk, NY (US)

(72) Inventors: Cornelius Brown Peethala, Slingerlands, NY (US); Hari Prasad Amanapu, Guilderland, NY (US); Raghuveer Reddy Patlolla, Guilderland, NY (US); Koichi Motoyama, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 16/776,982

(22) Filed: Jan. 30, 2020

(65) Prior Publication Data
US 2021/0242077 A1    Aug. 5, 2021

(51) Int. Cl.
*H01L 21/768* (2006.01)
*H01L 23/532* (2006.01)
(Continued)

(52) U.S. Cl.
CPC .... *H01L 21/76811* (2013.01); *H01L 23/5226* (2013.01); *H01L 23/5329* (2013.01);
(Continued)

(58) Field of Classification Search
CPC .......... H01L 21/76811; H01L 23/5329; H01L 23/5226; H01L 21/762; H01L 43/12; H01L 43/08
See application file for complete search history.

(56) References Cited

U.S. PATENT DOCUMENTS 6,436,824 B1    8/2002  Chooi et al.
6,927,113 B1 *  8/2005  Sahota ............... H01L 21/7684
                                                257/E21.583
(Continued)

OTHER PUBLICATIONS

Hashemi et al., "Selective Deposition of Dielectrics: Limits and Advantages of Alkanethiol Blocking Agents on Metal-Dielectric Patterns," ACS Applied Materials & Interfaces 8.48 (2016): 33264-33272.

*Primary Examiner* — Patricia D Valenzuela
(74) *Attorney, Agent, or Firm* — Cantor Colburn LLP; L. Jeffrey Kelly

(57) ABSTRACT

Embodiments of the invention include a method of forming a multi-layer integrated circuit (IC) structure that includes forming a first dielectric layer from a first dielectric material. A first conductive interconnect is formed having a first conductive interconnect surface. The first conductive interconnect is positioned in a first portion of the first dielectric layer, and the first conductive interconnect surface has a first conductive interconnect surface area. A second conductive interconnect is formed having a second conductive interconnect surface. The second conductive interconnect is above the first conductive interconnect and positioned in a second portion of the first dielectric layer. The second conductive interconnect surface has a second conductive interconnect surface area that is less than a first conductive interconnect surface area of the first conductive interconnect. A planarization stop region is formed above the second conductive interconnect and in a third portion of the first dielectric layer.

10 Claims, 9 Drawing Sheets

(51) Int. Cl.
*H01L 23/522* (2006.01)
*H01L 21/762* (2006.01)
*H01L 43/08* (2006.01)
*H01L 43/12* (2006.01)

(52) U.S. Cl.
CPC ............ *H01L 21/762* (2013.01); *H01L 43/08* (2013.01); *H01L 43/12* (2013.01)

(56) References Cited

U.S. PATENT DOCUMENTS

| | | | |
|---|---|---|---|
| 7,151,315 B2* | 12/2006 | Wu | H01L 21/76802 |
| | | | 257/E23.145 |
| 7,153,335 B2* | 12/2006 | Siddiqui | C09G 1/02 |
| | | | 106/11 |
| 8,404,581 B2 | 3/2013 | Tsai et al. | |
| 8,536,069 B2 | 9/2013 | Balseanu et al. | |
| 9,895,715 B2 | 2/2018 | Haukka et al. | |
| 10,079,147 B2 | 9/2018 | Siew et al. | |
| 2006/0017180 A1* | 1/2006 | Sarma | H01L 43/12 |
| | | | 257/E23.179 |
| 2006/0211235 A1* | 9/2006 | Usami | H01L 23/5222 |
| | | | 438/618 |
| 2009/0206489 A1 | 8/2009 | Li et al. | |
| 2009/0224374 A1 | 9/2009 | Bhatia et al. | |
| 2015/0348831 A1* | 12/2015 | Brovman | H01L 24/11 |
| | | | 438/653 |
| 2018/0012752 A1 | 1/2018 | Tapily | |
| 2018/0287051 A1* | 10/2018 | Bhosale | H01L 43/08 |

\* cited by examiner

PLANARIZATION STOP REGION FOR USE WITH LOW PATTERN DENSITY INTERCONNECTS

BACKGROUND

The present invention generally relates to fabrication methods and resulting structures for integrated circuit (IC) wafers. More specifically, the present invention relates to fabrication methods and resulting interconnect structures having planarization stop regions configured to achieve substantially uniform post-planarization height dimensions in an IC dielectric layer having low pattern density interconnects.

ICs are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts and other structures that communicatively couple to active regions (e.g., gate, source, and drain) of the device element. Layers of interconnection structures are formed above these logical and functional layers during the BEOL stage to complete the IC. Most ICs need more than one layer of wires/lines to form all the necessary connections, and as many as 5-12 layers are added in the BEOL process. The various interconnect structures in the BEOL layers can include the above-described interconnect lines/wires, as well as metal-filled interconnect vias configured to couple one line/wire to another and/or couple one wafer layer to another.

The increasing number of BEOL layers requires a highly planarized surface on every layer. Excessive material is removed and layer surfaces are planarized by the application of a suitable planarization processes such as chemical mechanical polishing (CMP). The performance of CMP processes is driven by a variety of factors including the CMP tool, process settings, the polishing pad, the diamond disk, the slurry composition, the slurry selectivity to the material(s) in the surface(s) being planarized, and the interconnect pattern density (IPD) of the BEOL layer being planarized. In general, IPD is the fractional area of a layer's surface that is occupied by the metal interconnects within a given window size.

SUMMARY

Embodiments of the invention provide a method of forming a multi-layer IC structure. In non-limiting embodiments of the invention, the method includes forming a substrate having a major surface. A first dielectric layer is formed from a first dielectric material to include a first dielectric layer top surface. The first dielectric layer is positioned above the major surface of the substrate. A first conductive interconnect is formed having a first conductive interconnect surface that is substantially parallel with respect to the major surface of the substrate. The first conductive interconnect is positioned in a first portion of the first dielectric layer, and the first conductive interconnect surface has a first conductive interconnect surface area. A second conductive interconnect is formed having a second conductive interconnect surface that is substantially parallel with respect to the major surface of the substrate. The second conductive interconnect is above the first conductive interconnect and positioned in a second portion of the first dielectric layer. The second conductive interconnect surface has a second conductive interconnect surface area that is less than the first conductive interconnect surface area. A planarization stop region is formed having a planarization stop region surface that is substantially co-planar with respect to the first dielectric layer top surface. The planarization stop region is above the second conductive interconnect and in a third portion of the first dielectric layer.

Embodiments of the invention provide a multi-layer IC structure. In non-limiting embodiments of the invention, the structure includes a substrate having a major surface. A first dielectric layer of the structure is formed from a first dielectric material and a first dielectric layer top surface, wherein the first dielectric layer is positioned above the major surface of the substrate. A first conductive interconnect of the structure has a first conductive interconnect surface that is substantially parallel with respect to the major surface of the substrate. The first conductive interconnect is positioned in a first portion of the first dielectric layer, and the first conductive interconnect surface has a first conductive interconnect surface area. A second conductive interconnect of the structure has a second conductive interconnect surface that is substantially parallel with respect to the major surface of the substrate. The second conductive interconnect is above the first conductive interconnect and positioned in a second portion of the first dielectric layer. The second conductive interconnect surface has a second conductive interconnect surface area that is less than the first conductive interconnect surface area. A planarization stop region of the structure has a planarization stop region surface that is substantially co-planar with respect to the first dielectric layer top surface. The planarization stop region is above the second conductive interconnect and in a third portion of the first dielectric layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 3-13 depict the results of fabrication operations for forming the "interconnect plus planarization stop region" of the IC wafer shown in FIGS. 1, 2A, and 2B, in which:

FIG. 3 depicts a schematic illustration of an IC wafer after fabrication operations according to embodiments of the invention;

FIG. 4 depicts a schematic illustration of an IC wafer after fabrication operations according to embodiments of the invention;

FIG. 5 depicts a schematic illustration of an IC wafer after fabrication operations according to embodiments of the invention;

FIG. 6 depicts a schematic illustration of an IC wafer after fabrication operations according to embodiments of the invention;

FIG. 7 depicts a schematic illustration of an IC wafer after fabrication operations according to embodiments of the invention;

FIG. 8 depicts a schematic illustration of an IC wafer after fabrication operations according to embodiments of the invention;

FIG. 9 depicts a schematic illustration of an IC wafer after fabrication operations according to embodiments of the invention;

FIG. 10 depicts a schematic illustration of an IC wafer after fabrication operations according to embodiments of the invention;

FIG. 11 depicts a schematic illustration of an IC wafer after fabrication operations according to embodiments of the invention;

FIG. 12 depicts a schematic illustration of an IC wafer after fabrication operations according to embodiments of the invention; and FIG. 13 depicts a schematic illustration of an IC wafer after fabrication operations according to embodiments of the invention.

Figure 1:
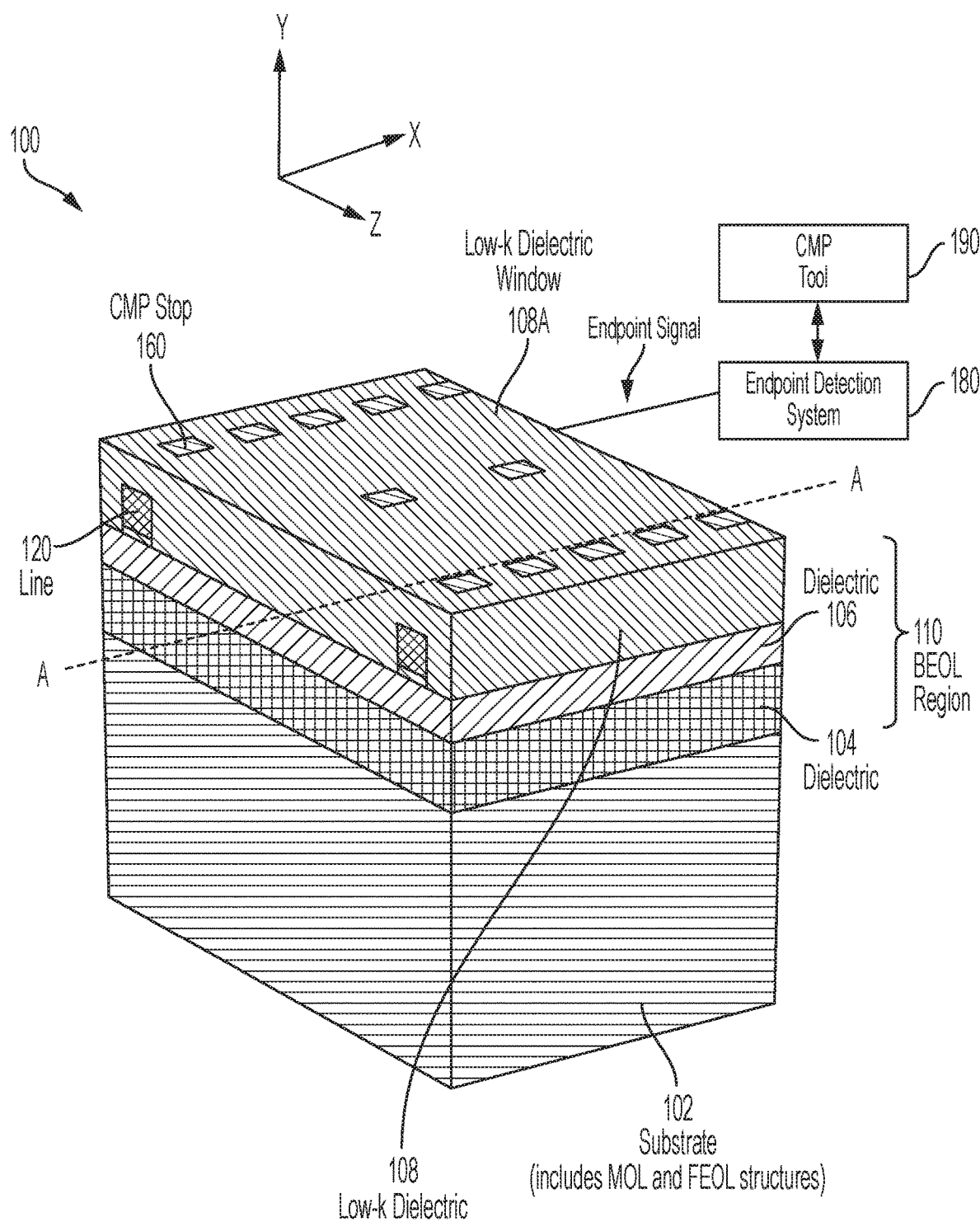
FIG. 1 depicts a three-dimensional view of a portion of an IC wafer that incorporates aspects of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two- or three-digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, semiconductor devices are used in a variety of electronic applications. ICs are typically formed from various circuit configurations of semiconductor devices (e.g., transistors, capacitors, resistors, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

In contemporary semiconductor fabrication processes, a large number of semiconductor devices and conductive interconnect layers are fabricated. More specifically, during the first portion of chip-making (i.e., the FEOL stage), the individual components (transistors, capacitors, etc.) are fabricated on the wafer. The MOL stage follows the FEOL stage and typically includes process flows for forming the contacts and other structures that communicatively couple to active regions (e.g., gate, source, and drain) of the device element. In the BEOL stage, these device elements are connected to each other through a network of interconnect structures to distribute signals, as well as power and ground. The conductive interconnect layers formed during the BEOL stage serve as a network of pathways that transport signals throughout an IC, thereby connecting circuit components of the IC into a functioning whole and to the outside world. Because there typically isn't enough room on the chip surface to create all of the necessary connections in a single layer, chip manufacturers build vertical levels of interconnects. While simpler ICs can have just a few metallization layers, complex ICs can have ten or more layers of wiring.

BEOL-stage interconnect structures that are physically close to FEOL-stage components (e.g., transistors and the like) need to be small because they attach/join to the components that are themselves very small and often closely packed together. These lower-level lines, which can be referred to as local interconnects, are usually thin and short in length. Global interconnects are higher up in the IC layer structure and travel between different blocks of the circuit. Thus, global interconnects are typically thick, long, and more widely separated local interconnects. Vertical connections between interconnect levels (or layers), called metal-filled vias, allow signals and power to be transmitted from one layer to the next. For example, a through-silicon via (TSV) is a conductive contact that passes completely through a given semiconductor wafer or die. In multi-layer IC configurations, for example, a TSV can be used to form vertical interconnections between a semiconductor device located on one layer/level of the IC and an interconnect layer located on another layer/level of the IC. These vertical interconnect structures include an appropriate metal and provide the electrical connection of the various stacked metallization layers.

Insulating dielectric materials are used throughout the layers of an IC to perform a variety of functions including stabilizing the IC structure and providing electrical isolation of the IC elements. Additionally, in order to provide a parasitic resistance and capacitance (RC) level that is sufficiently low to support high signal speed applications, regions of the BEOL dielectric material can be formed from low-k and/or ultra-low-k (ULK) dielectric materials having a dielectric constant of less than silicon dioxide, and the interconnect structures (e.g., wire lines and vias) can be formed from copper-containing material. In general, a low-k dielectric generally has a k value that is less than about 4, and a ULK dielectric generally has a k value that is less than about 2.5.

However, there are difficulties with integrating low-k/ULK dielectric materials with metal interconnects in the dielectric layers of an IC. For example, it is a challenge to planarize a low-k/ULK BEOL layer with metal interconnects in a well-controlled manner that achieves uniform post-planarization height dimensions in the low-k/ULK BEOL layers and the metal interconnects. Non-uniform interconnect/dielectric heights result in different resistance levels across the BEOL layer interconnect structures, which results in undesirable resistance (R) variability. Non-uniform interconnect/dielectric heights also result in different spacings between the interconnect structures, which results in undesirable capacitance (C) variability. The RC variability that results from height/spacing variability in the BEOL layer negatively impacts IC performance, particularly for high speed application.

Planarization-induced interconnect height/spacing variability in BEOL dielectric layers results from a variety of factors, including, for example, the selectivity of the CMP slurry to the dielectric and the interconnect metal, as well as the ability of the interconnect metal at the dielectric/metal interface to generate a sufficiently strong endpoint signal. In general, the endpoint is when the CMP process has removed the desired thickness of material. The basic function of endpoint detection methods is to identify a change in signal strength of some measurement that occurs during the transition from one material layer (e.g., a low-k/ULK dielectric) to the next (e.g., a low-k/ULK dielectric with metal interconnects/vias), which is called the micro-signal change. Ideally, the endpoint signal's strength is related to some set of material properties so that it remains constant as the process polishes one material layer and transitions instantaneously to a new distinct value when that layer has been completely removed and polished. The different measurements that can be used in in-situ endpoint detection can include frictional, optical, acoustic/vibrational, thermal, electrical, and chemical/electrochemical. Endpoint detection schemes that do not accurately detect the endpoint can result in over/under polishing, which can lead to height/spacing variability and defects such as dishing and erosion.

In an ideal scenario, CMP slurry selectivity to the metal interconnect structures should be sufficiently different from CMP selectivity to the BEOL dielectric that the CMP process stops (or slows down significantly) when it reaches the interconnect metal. CMP slurries generally include water-based chemicals with abrasive particles and chemical additives. Chemicals in the CMP slurry react with surface materials, thereby forming chemical compounds that can be removed by abrasive particles. Abrasive particulates in the slurry mechanically abrade the wafer surface and remove materials. Chemical additives in the CMP slurries help to achieve desired polishing results. Different polishing processes require different slurries. CMP slurry can be engineered and formulated to impact removal rate, selectivity, planarity, and uniformity for a specific application. In general, CMP slurry selectivity is the ratio of removal rates of different materials. The CMP slurry chemistry is the primary factor that affects removal selectivity of CMP process.

However, the CMP slurries that are optimum for planarizing low-k/ULK dielectric materials do not provide the level of selectivity to interconnect metals to allow the CMP process to uniformly stop (or slow down) on the interconnect metal. The CMP slurries that planarize dielectric surfaces well are also known to cause defects in metal. Although it is possible to engineer a CMP slurry formulation for the specific materials being planarized, engineering such slurries to minimize metal defects and stop (or slow down) the CMP process at the interconnect metal requires tradeoffs among what is optimum for low-k/ULK dielectric planarization; what is required for minimal metal defects; and what is required for providing a sufficient level of slurry selectivity to the interconnect metal to allow the interconnect metal to uniformly stop the CMP process.

Even if a CMP slurry is engineered to planarize low-k/ULK dielectric material (albeit sub-optimally), provide low metal defects, and provide a level of CMP slurry selectivity to the interconnect metal that would allow the interconnect metal to stop/slow the CMP process, such CMP slurries would still require a sufficient IPD in the low-k/ULK dielectric layer. As previously noted herein, the IPD of a wafer surface is the fractional area of the layer surface that is occupied by the metal interconnects within a given window size. If the IPD of the low-k/ULK dielectric layer is not sufficiently high (e.g., above a threshold for allowing the interconnect structures on the surface-under-planarization to generate a sufficiently strong endpoint signal to operate an endpoint detection system), even a CMP slurry engineered in the manner described above would not provide the necessary CMP slurry selectivity and/or a sufficiently strong endpoint signal to stop the CMP process uniformly on the low-IPD region of the low-k/ULK dielectric. In an example of such a situation, when the CMP process is close to its desired (or targeted) end (i.e., the point where the surface-being-polished changes from the dielectric alone to a combination of the dielectric and metal interconnect structures), the polish pad of the CMP tool will begin to contact and polish the metal-containing dielectric layer, which changes the friction forces experience by the polish pad. In response to this change in friction forces, current of the polish head rotary motor will change to maintain a constant pad rotation rate. By monitoring the change of motor current, an endpoint detection system can find the endpoint of the CMP process. However, because of the low-IPD in the dielectric layer, the endpoint signal will be insufficiently strong to operate the endpoint detection system so the CMP process will continue past the targeted endpoint and start to contact and polish the metal interconnect structures, thereby leading to under/over polishing, which can lead to height/spacing variability and defects such as dishing and erosion.

In situations where the IPD of the low-k/ULK dielectric layer is not sufficiently high (e.g., above a threshold for allowing the interconnect structure to generate a sufficiently strong endpoint signal to operate an endpoint detection system), the CMP process would need to be stopped in a timed fashion, which is less controllable than using the interconnect metal as stop layer that triggers an endpoint detection system. The use of a timed CMP stop mechanisms can also result in under/over polishing, which can lead to height/spacing variability and defects such as dishing and erosion.

Accordingly, known CMP-based planarization techniques require various non-optimal performance tradeoffs among what is optimal for planarizing a dielectric; what is optimal for minimizing interconnect metal defects; and what is optimal for uniformly stopping the dielectric planarization process at the metal interconnects in the dielectric, particularly when the pattern density of the interconnects (i.e., the IPD) is below a threshold (e.g., below about 50% of the layer or the area of the surface-under-planarization) for generating a reliable endpoint signal.

Turning now to an overview of the aspects of the invention, embodiments of the invention address the height/spacing variability problems associated with known methods of planarizing low-k/ULK BEOL layers by forming, in accordance with aspects of the invention, a planarization stop region that is selectively positioned over the interconnect structures embedded in the low-k/ULK BEOL layer. In embodiments of the invention, the planarization stop region is formed from a material (e.g., SiN, SiCN, SiC, and SiOCN) that is more compatible with CMP processes than the conductive materials (e.g., metals) from which interconnect structures are formed. For example, in embodiments of the invention, the planarization stop region material is selected such that its selectivity to CMP slurries that are optimal for low-k/ULK dielectric materials is sufficient to stop (or slow down) the CMP process when it reaches the planarization stop region. In embodiments of the invention, the planarization stop region can be formed from materials that further facilitate better control of the CMP process by having hardness, modulus, and CMP polish rate characteristics that generate a suitably strong endpoint signal independently of the IPD of the underlying interconnect metal, and independently of the pattern density of the planarization stop region(s). For example, a planarization stop region in accordance with aspects of the invention can generate a suitably strong endpoint signal for an IPD that is below about 50%. In some embodiments of the invention, a planarization stop region in accordance with aspects of the invention can generate a suitably strong endpoint signal when IPD is between about 30% and about 50%. Suitable materials having the above-described hardness, modulus, and CMP polish rate characteristics for use as the novel planarization stop region include silicon nitride, silicon carbide, and similar materials.

These features in accordance with aspects of the invention allow the CMP process to be reliably controlled by an endpoint detection system rather than a time controlled stop mechanism even when the IPD of the low-k/ULK dielectric layer is not above a threshold for allowing the interconnect structure to generate a sufficiently strong endpoint signal to operate an endpoint detection system. Without benefit of the planarization stop region in accordance with aspects of the invention, the endpoint signal provided by the metal interconnect would be too weak to rely on well-controlled endpoint detection system to stop the CMP process. By reliably stopping the CMP process on the novel planarization stop region, embodiments of the invention avoid interaction between the various elements/operations of CMP processing and the interconnect metal, thereby protecting the interconnect structure from damage (e.g., galvanic corrosion) due to exposure to CMP elements/operations. Additionally, the previously-described CMP slurry can also be selected such that it does not cause a level defects in the low-k/ULK dielectric and the planarization stop region material that exceeds acceptable ranges.

In embodiments of the invention, suitable materials for the planarization stop region can include SiN, SiCN, SiC, and SiOCN. In embodiments of the invention, suitable materials for the low-k/ULK materials of the BEOL layer can include, for example, fluorine-doped silicon dioxide, porous organosilicate glass material (e.g., SiCOH), porous silicon dioxide, and organic polymeric materials such as polyimide, polynorbornenes, benzocyclobutene, and hydrogen sisesquioxane, and the like. In embodiments of the invention, suitable CMP slurry compounds can include abrasives, deionized water, and chemical additives. Examples of suitable abrasives include colloidal silica or ceria. Example of suitable chemical additives include amino acids, carboxylic acids, and surfactants.

Embodiments of the invention are particularly useful when the novel planarization stop region is formed on an interconnect structure in which the line portion of the interconnect is formed below the via portion of the interconnect, which is referred to herein as a top-via interconnect scheme. In the top-via interconnect scheme described herein, the top surface of the via portion of the interconnect structure is much smaller surface area than would be available if the line portion of the interconnect structure were formed over the via using a line-top interconnect scheme. The relative top surface areas of the interconnect structure in a top-via interconnect scheme compared with a top-line interconnect scheme depend on the particular interconnect pattern design. In some applications, the top surface in a top-via interconnect scheme can be from about 5% to about 35% of the top surface area that would have resulted from the same interconnect pattern design being implemented as a top-line interconnect scheme.

Figure 2A:
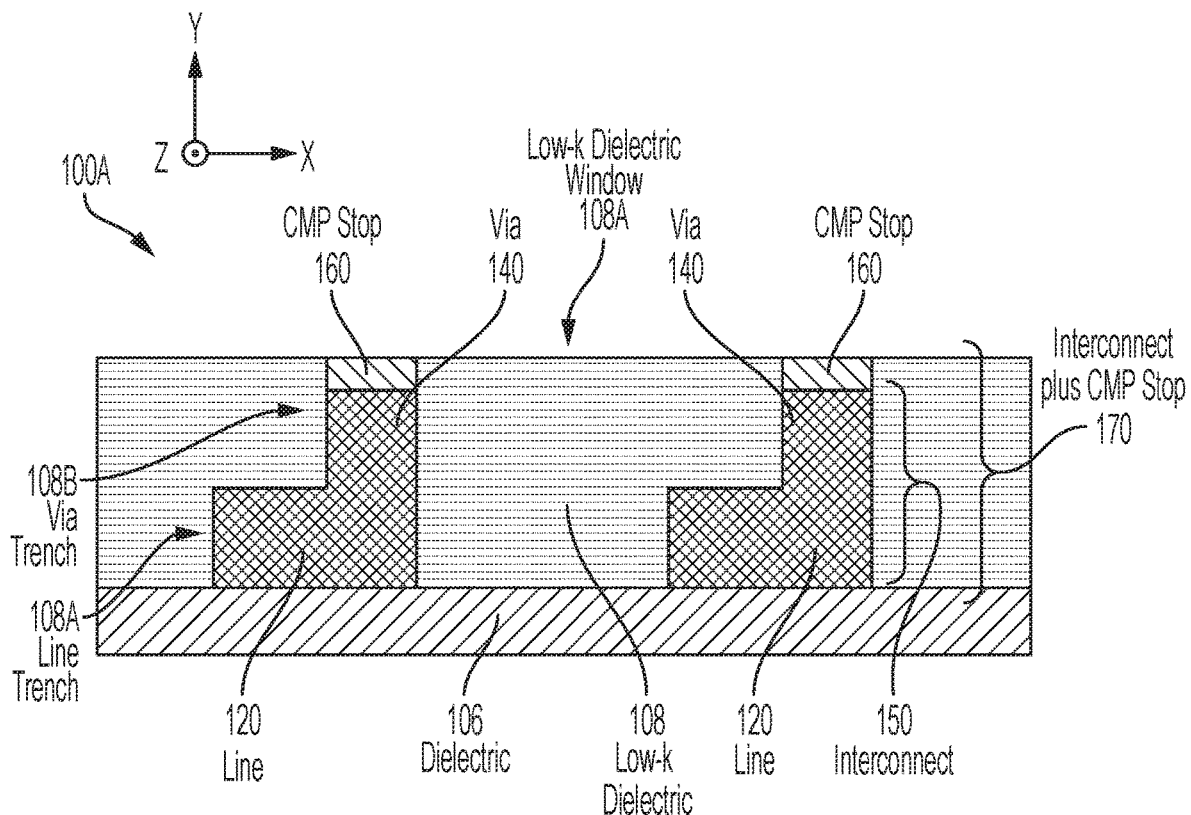
FIG. 2A depicts a cross-sectional view, taken along line A-A, of a portion of the IC wafer shown in FIG. 1.
Figure 2B:
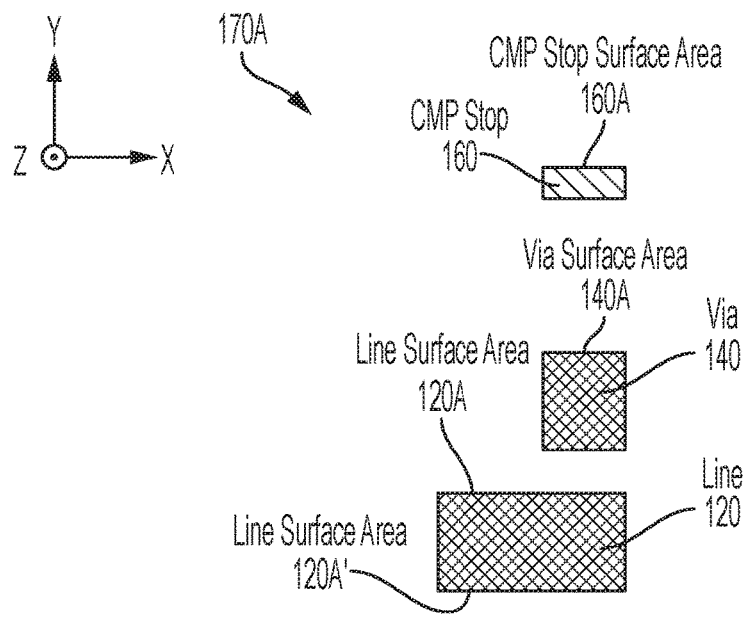
FIG. 2B depicts an isolated/exploded view of an "interconnect plus planarization stop region" shown in FIG. 2A and embodying aspects of the invention.
Figure 2C:
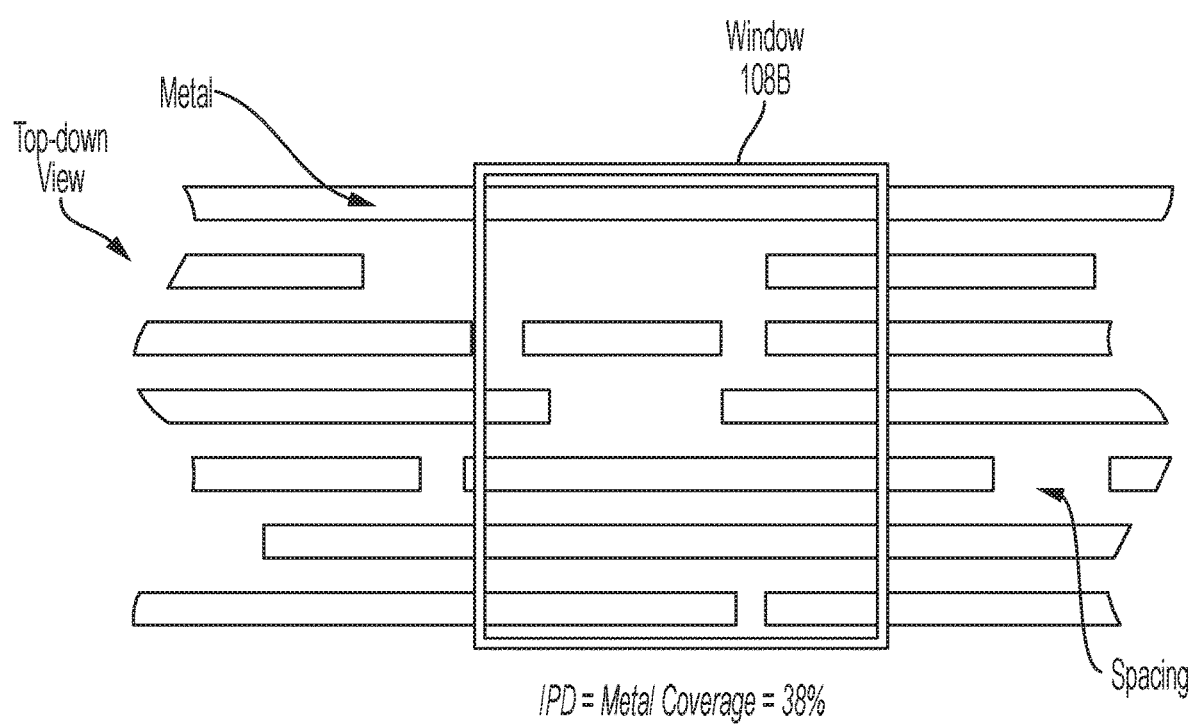
FIG. 2C depicts a portion of an IC wafer that illustrates the concept of interconnect pattern density (IPD), which is relevant to aspects of the invention.

Turning now to a more detailed description of aspects of the present invention, FIG. 1 depicts a portion of an IC wafer 100 in accordance with aspects of the invention; FIG. 2A depicts a cross-sectional view of a sub-section 100A of the IC wafer 100, taken along line A-A shown in FIG. 1; FIG. 2B depicts an isolated/exploded view of the novel interconnect structure 170, which is shown in FIG. 2B by reference number 170A; and FIG. 2C depicts a top-down view of an IC wafer surface that illustrates the concept of interconnect pattern density (IPD). The following descriptions of the IC wafer 100 make reference to depictions shown in FIGS. 1, 2A, 2B, and 2C. As best shown in FIG. 1, the IC wafer 100 includes a substrate 102 having middle-of-line (MOL) and front-end-of-line (FEOL) structures (not shown separately) formed in MOL and FEOL regions (not shown separately) of the substrate 102. A multi-layered BEOL region 110 is formed over the substrate 102. The BEOL region 110 includes a first BEOL dielectric layer 104, a second BEOL dielectric layer 106, and a third BEOL dielectric layer 108, configured and arranged as shown. Although three dielectric layers 104, 106, 108 are shown in FIG. 1, the multi-layered BEOL region 110 can be provided with any number of dielectric layers. The third BEOL dielectric layer 108 is formed from a low-k (or ULK) dielectric material having a network of novel "interconnect plus CMP stop" structures 170 (best shown in FIG. 2A) formed therein in accordance with aspects of the invention. In accordance with aspects of the invention, some or all of the layers 104, 106, 108 in the BEOL region 110 can be provided with the novel interconnect structures 170. The network of novel interconnect structures 170 can be implemented as a network of wires/lines 120 and metal-filled vias 120 (shown in FIG. 2A) configured to communicatively couple semiconductor devices (i.e., MOL/FEOL structures) of the substrate 102 to one another. In general, the lines/wires 120 conduct current horizontally in a predetermine pattern extending along the Z-axis and/or the X-axis, and the metal-filled vias 120 conduct current vertically along the Y-axis. In accordance with aspects of the invention, the novel interconnect structures 170 further include CMP stop regions 160. The novel interconnect structures 170 are formed in a "top-via" configuration, wherein the metal-filled via regions 140 are formed over the line regions 120, and wherein the CMP stop regions 160 are formed over the metal-filled via regions 140.

Insulating dielectric materials are used throughout the layers of the IC wafer 100 (best shown in FIG. 1) to perform a variety of functions including stabilizing the IC wafer 100 and providing electrical isolation of the IC devices and interconnects. For example, the novel interconnect structures 170 (best shown in FIG. 2A) in the BEOL region 110 of the IC wafer 100 are isolated by dielectric layers 104, 106, 108 to prevent the interconnect structure 170 from creating a short circuit with other metal layers/structures in the IC wafer 100. Additionally, in order to provide a parasitic resistance and capacitance (RC) level that is sufficiently low to support high signal speed applications, layers of the BEOL region 110 can be formed from low-k and/or ULK dielectric materials having a dielectric constant of less than silicon dioxide, and the interconnect structures (e.g., wire lines and vias) can be formed from copper-containing material. The RC product is a measure of the time delay introduced into the circuitry by the BEOL interconnect structures. As previously noted herein, a low-k dielectric generally has a k value that is less than about 4, and a ULK dielectric generally has a k value that is less than about 2.5. Suitable dielectric low-k/ULK materials for reducing interconnect capacitance include, for example, fluorine-doped silicon dioxide, porous organosilicate glass material (e.g., SiCOH), porous silicon dioxide, and organic polymeric materials such as polyimide, polynorbornenes, benzocyclobutene, and hydrogen sisesquioxane, and the like.

Figure 3:
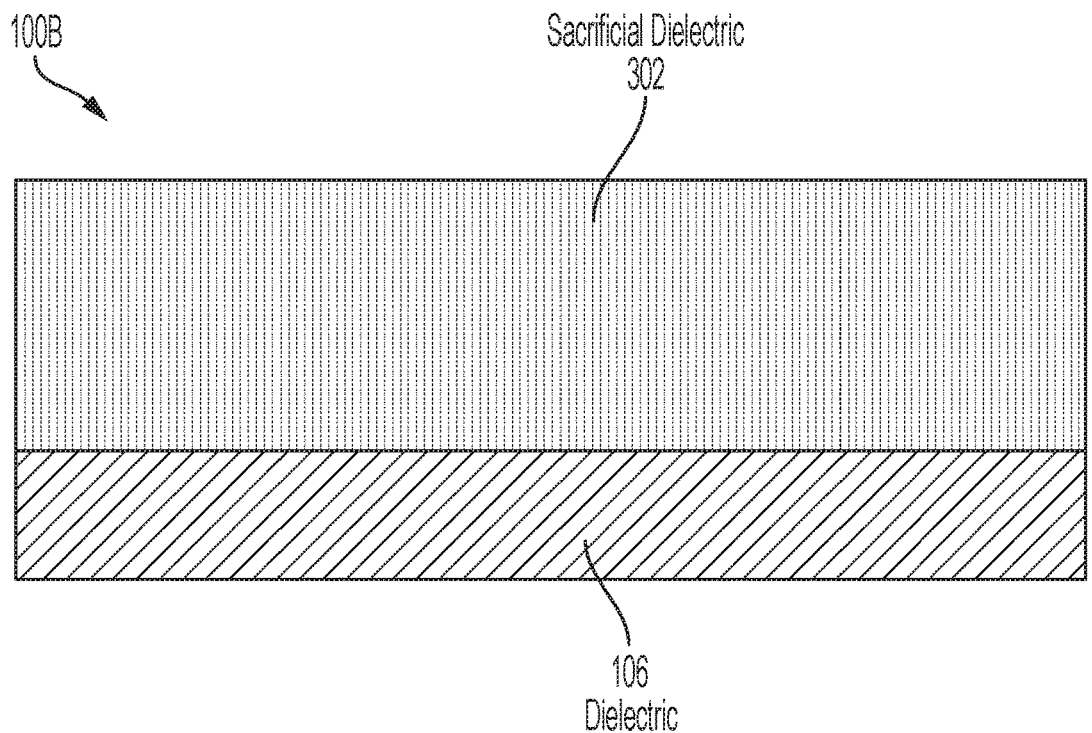
Figure 4:
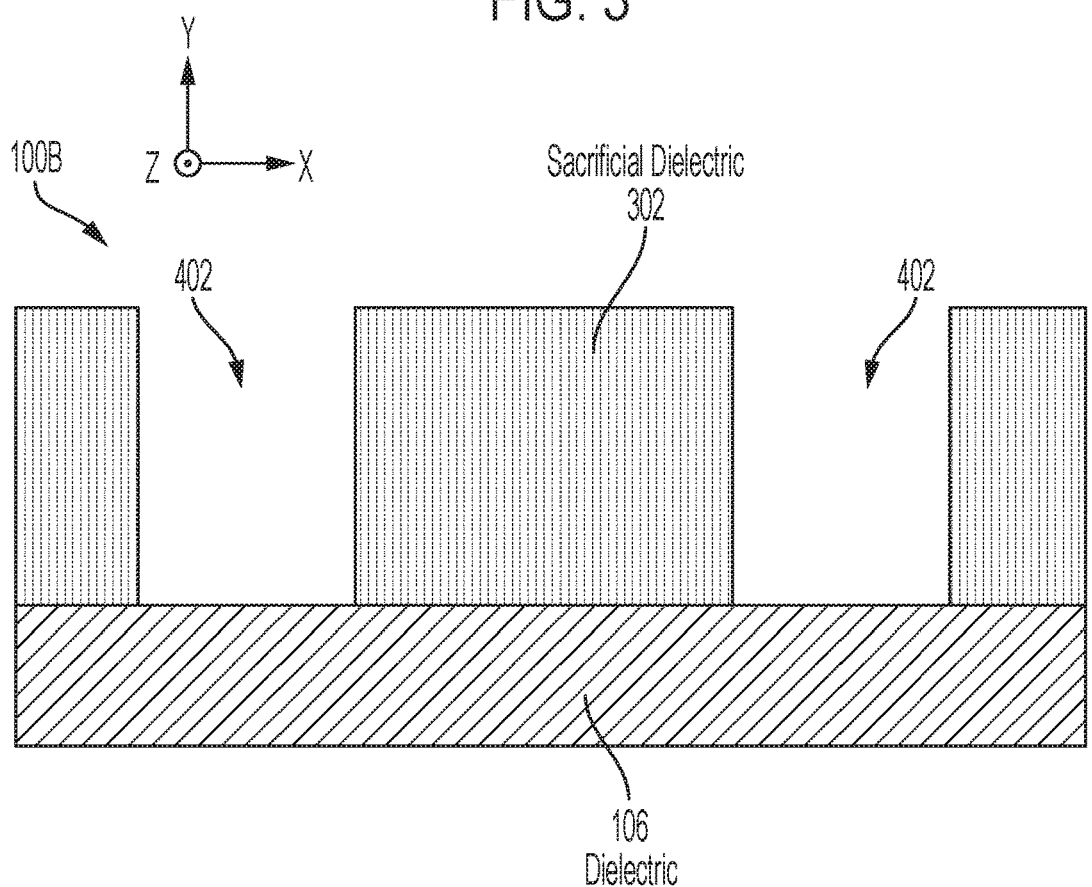

The novel interconnect structures 170 shown in FIG. 2A can be formed using, for example, a dual damascene process that includes depositing a sacrificial dielectric layer 302 (shown in FIG. 3) as a blanket film over the dielectric layer 106 (shown in FIGS. 2A and 3), lithographically patterning the sacrificial dielectric layer 302, and applying a reactive ion etched (RIE) to create the necessary pattern of line/wire/via trenches 402 (shown in FIG. 4). The trenches 402 are coated by a refractory metal barrier (not shown) such as Ta and $TaN_x$ followed by a thin sputtered metal (e.g., copper) seed layer (not shown separately). The seed layer allows for the electrochemical deposition (ECD) of a thick metal layer that fills up the trenches 402. Excessive metal is removed and the top surface of the sacrificial dielectric 302 is planarized by a first planarization process such as a first CMP. Post-first-CMP, a layer of planarization stop material 702 (shown in FIG. 7) is deposited over the planarized surface then patterned and etched to form the planarization stop regions 160 and the vias 140. The sacrificial dielectric 302 is replaced with the low-k (or ULK) dielectric layer 108 (shown in FIGS. 2A and 13), and excess low-k (or ULK) material is removed and the top surface of the low-k dielectric layer 108 is planarized using a second CMP to form the planarized surface/window 108A (shown in FIGS. 1 and 2A).

In accordance with aspects of the invention, and as best shown in FIG. 2A, the planarization stop region 160 is selectively positioned over the interconnect structures 150 (and more specifically over the metal-filled vias 140) embedded in the low-k/ULK layer 108. In embodiments of the invention, the planarization stop region 160 is formed from a material (e.g., SiN, SiCN, SiC, and SiOCN) that is more compatible with CMP processes than the conductive materials (e.g., metals) from which the interconnect structures 150 are formed. For example, in embodiments of the invention, the material from which the planarization stop regions 160 are formed is selected such that the material's selectivity to CMP slurries that are optimal for low-k/ULK dielectric materials is sufficient to stop (or slow down) the second CMP process when it reaches the planarization stop region 160. In embodiments of the invention, the planarization stop region 160 can be formed from materials that further facilitate better control of the second CMP process by generating a suitably strong endpoint signal independently of the IPD of the underlying interconnect structures 150, and independently of the pattern density of the planarization stop regions 160. These features, in accordance with aspects of the invention, allow the second CMP process to be reliably controlled by an endpoint detection system 180 (shown in FIG. 1) rather than a time-controlled CMP stop mechanism even when the IPD of the low-k/ULK dielectric layer 108 is not above a threshold for allowing the interconnect structures 150 to generate a sufficiently strong endpoint signal to operate the endpoint detection system 180 and the CMP tool 190.

The basic function of the endpoint detection system 180 is to identify a change in signal strength of some measurement that occurs during the transition from one material layer (e.g., the low-k/ULK dielectric layer 108) to the next (e.g., the low-k/ULK dielectric 108 with planarization stop regions 160), which is called the micro-signal change. In accordance with aspects of the invention, the endpoint signal's strength is related to some set of material properties so that it remains constant as the process polishes one material layer and transitions instantaneously to a new distinct value when that layer has been completely removed and polishing. The different measurements that can be used in in-situ endpoint detection can include frictional, optical, acoustic/vibrational, thermal, electrical, and chemical/electrochemical. Endpoint detection schemes that do not accurately detect the endpoint can result in over/under polishing, which can lead to height/spacing variability and defects such as dishing and erosion.

Without benefit of the planarization stop region 160, which is formed in accordance with aspects of the invention, the endpoint signal would need to be provided by the metal interconnects 150 (shown in FIG. 2A). The endpoint signal generated by the metal interconnects 150 alone with no stop region 160 would be too weak to use the well-controlled endpoint detection system 180 to stop the second CMP process being performed by the CMP tool 190 (shown in FIG. 1). The presence of the novel planarization stop region 160 allows the CMP tool 190 and the second CMP process to be reliably stopped on the novel planarization stop regions 160. Accordingly, embodiments of the invention avoid interaction between the various elements/operations of second CMP process and the interconnect structures 150, thereby protecting the interconnect structures 150 from damage (e.g., galvanic corrosion) due to exposure to CMP elements/operations. Additionally, the previously-described second CMP slurry can also be selected such that it does not cause a level defects in the low-k/ULK dielectric layer 108 and the planarization stop region 160 that exceeds acceptable ranges.

Accordingly, the novel interconnect structures 170 (best shown in FIG. 2A) avoid CMP-induced interconnect height/spacing variability in the BEOL dielectric layer 108, including, for example, those that could, theoretically, result from factors such as the selectivity of the CMP slurry to the dielectric layer 108 and the planarization stop regions 160, as well as the ability of the planarization stop region 160 to generate a sufficiently strong endpoint signal to stop the CMP process being performed by the CMP tool 190 (best shown in FIG. 1). In accordance with aspects of the invention, the material used to form the planarization stop regions 160 is selected such that CMP slurry selectivity to the planarization stop regions 160 is sufficiently different from CMP slurry selectivity to the low-k/ULK layer 108 that the CMP process applied by the CMP tool 190 stops (or slows down significantly) when it reaches the planarization stop regions 160. In accordance with aspects of the invention, the material of the planarization regions 160 can be further selected such that it has sufficient selectivity to the CMP slurries that are optimum for planarizing low-k/ULK dielectric materials to allow the CMP process to uniformly stop (or slow down) on the planarization stop regions 160, thereby avoiding the previously-described tradeoffs that are required when the metal that forms the interconnect structures 150 (shown in FIG. 2A) is used to stop the CMP process.

In accordance with aspects of the invention, and as previously described herein, the planarization stop region 160 can be formed from materials that facilitate implementation of a well-controlled second CMP process by generating a suitably strong endpoint signal independently of the IPD of the underlying interconnect structures 150, and independently of the pattern density of the planarization stop regions 160 on the low-k/ULK surface/window 108A (best shown in FIG. 1). As previously noted, the IPD of a wafer surface is the fractional area of the layer surface that is occupied by the metal interconnects within a given window size (e.g., window 108B shown in FIG. 2C). If the interconnect structures 150 are used to stop the second CMP process, and if the IPD of the low-k/ULK dielectric layer 108 is not sufficiently high (e.g., above a threshold for allowing the interconnect structures 150 to generate a sufficiently strong endpoint signal to operate the endpoint detection system 180), the CMP slurry selectivity to the interconnect structures 150 would not provide a sufficiently strong endpoint signal to stop the CMP process uniformly on the low-IPD region of the low-k/ULK dielectric.

Accordingly, the novel interconnect structures 170 having interconnect structures 150 and planarization stop region 160 formed thereon enable the selection of materials for the planarization stop regions that avoid the various non-optimum performance tradeoffs that would be required if the metal of the underlying interconnect structure 150 were used to stop the planarization process. The various non-optimum tradeoffs that are avoided using aspects of the invention include what is optimal for planarizing a dielectric; what is optimal for minimizing interconnect metal defects; and what is optimal for uniformly stopping the dielectric planarization process at a planarization stop region in the dielectric, particularly when the pattern density of the planarization stop region is below a threshold for generating a reliable endpoint signal.

In embodiments of the invention, suitable materials for the planarization stop region can include SiN, SiCN, SiC, and SiOCN. In embodiments of the invention, suitable materials for the low-k/ULK materials of the BEOL layer can include, for example, fluorine-doped silicon dioxide, porous organosilicate glass material (e.g., SiCOH), porous silicon dioxide, and organic polymeric materials such as polyimide, polynorbornenes, benzocyclobutene, and hydrogen sisesquioxane, and the like. In embodiments of the invention, suitable CMP slurry compounds can include abrasives, deionized water, and chemical additives. Examples of suitable abrasives include colloidal silica and/or ceria. Example of suitable chemical additives include amino acids, carboxylic acids, and surfactants.

Embodiments of the invention are particularly useful in addressing the height/spacing variability problems when the novel planarization stop regions 160 are formed on interconnect structures 150 in which the line 120 of each interconnect structure 150 is formed below the via 140 of each interconnect structure 150, which is referred to herein as a top-via interconnect scheme. As best shown in FIG. 2B, in the top-via interconnect scheme described herein, the top surface 140A of the via 140 is much smaller surface area than the line surface areas 120A, 120A'. Accordingly, the top-via interconnect scheme provides less interconnect surface area to the polishing pad during a CMP process than would be available if the line 120 each interconnect structure 150 were formed over the via 140 using a line-top interconnect scheme. The relative top surface areas of the interconnect structure in a top-via interconnect scheme compared with a top-line interconnect scheme depend on the particular interconnect pattern design. In some applications, the top surface in a top-via interconnect scheme can be from about 5% to about 35% of the top surface area that would have resulted from the same interconnect pattern design being implemented as a top-line interconnect scheme.

After the second CMP process, a thin dielectric film also known as a "cap layer" (not shown) can be deposited over the low-k/ULK dielectric window 108A. The cap layer acts as a diffusion barrier to prevent diffusion of copper from the interconnect structures 150 into the surrounding dielectric material during subsequent BEOL processing steps. Electrical contact can be made to the interconnect structures 150 forming contacts (or other interconnect structures) configured and arranged to extend through the cap layer and the planarization stop regions 160 to make electrical contact with the interconnect structures. In embodiments of the invention, the cap layer can be SiN.

FIGS. 3-13 and 2A depict the results of fabrication operations for forming the novel interconnect structure 170 in accordance with aspects of the invention. The IC wafer 100 (shown in FIG. 1) while under fabrication is depicted as IC wafer 100B in FIGS. 3-13, and as IC wafer 100A FIG. 2A. A variety of well-known IC fabrication operations are suitable for forming the multi-layered IC wafer 100B to the fabrication stages shown in FIGS. 1 and 2A. Accordingly, in the interest of brevity, such well-known fabrication operations are either omitted or described and illustrated at a high level.

FIG. 3 depicts a schematic illustration of the IC wafer 100B after fabrication operations according to embodiments of the invention, wherein known IC fabrication techniques have been used to form the substrate 102 (shown in FIG. 1), the dielectric layer 104 (shown in FIG. 1), and the dielectric layer 106 (shown in FIGS. 1, and 3). Known layer deposition techniques (e.g., ALD) have been used to deposit a sacrificial dielectric layer 302 over the dielectric layer 106. In accordance with aspects of the invention, the sacrificial dielectric layer 302 is formed from a dielectric material (e.g., an oxide) that is stronger and easier to pattern, etch, and planarize than low-k or ULK dielectric materials.

FIG. 4 depicts a schematic illustration of the IC wafer 100B after fabrication operations according to embodiments of the invention, wherein known IC fabrication techniques have been used to form interconnect (or line/wire/via) trenches 402 in the sacrificial dielectric layer 302 in accordance with the interconnect layout pattern of the particular ID wafer design. In aspects of the invention, the known fabrication techniques can include lithographically patterning the sacrificial dielectric layer 302 and applying a reactive ion etched (RIE) to create the necessary pattern of the line/wire/via trenches 402.

Figure 5:
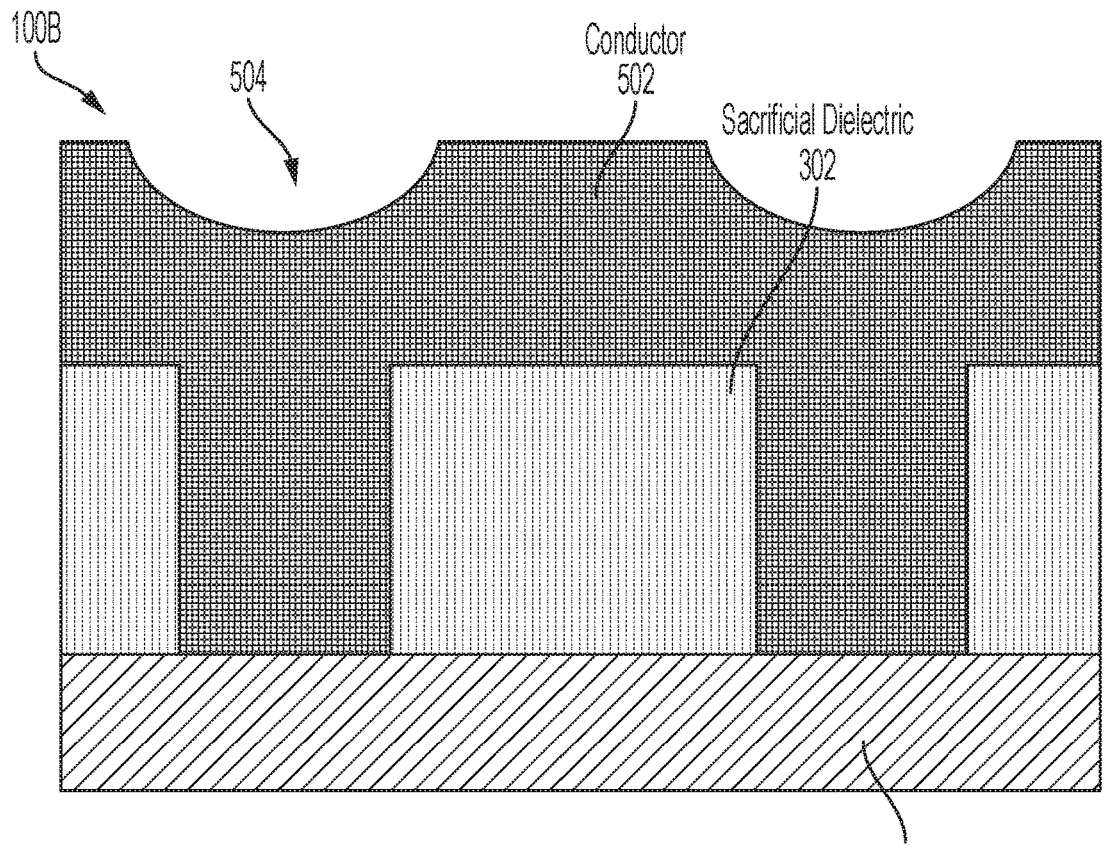

In FIG. 5, known semiconductor fabrication techniques have been used to coat the trenches 402 with a refractory metal barrier (not shown separately) such as Ta and TaN followed by a thin sputtered metal (e.g., copper) seed layer (not shown separately). The seed layer allows for the electrochemical deposition (ECD) of a thick metal conductor layer 502 that fills up the trenches 402 and covers the sacrificial dielectric layer 302.

Figure 6:
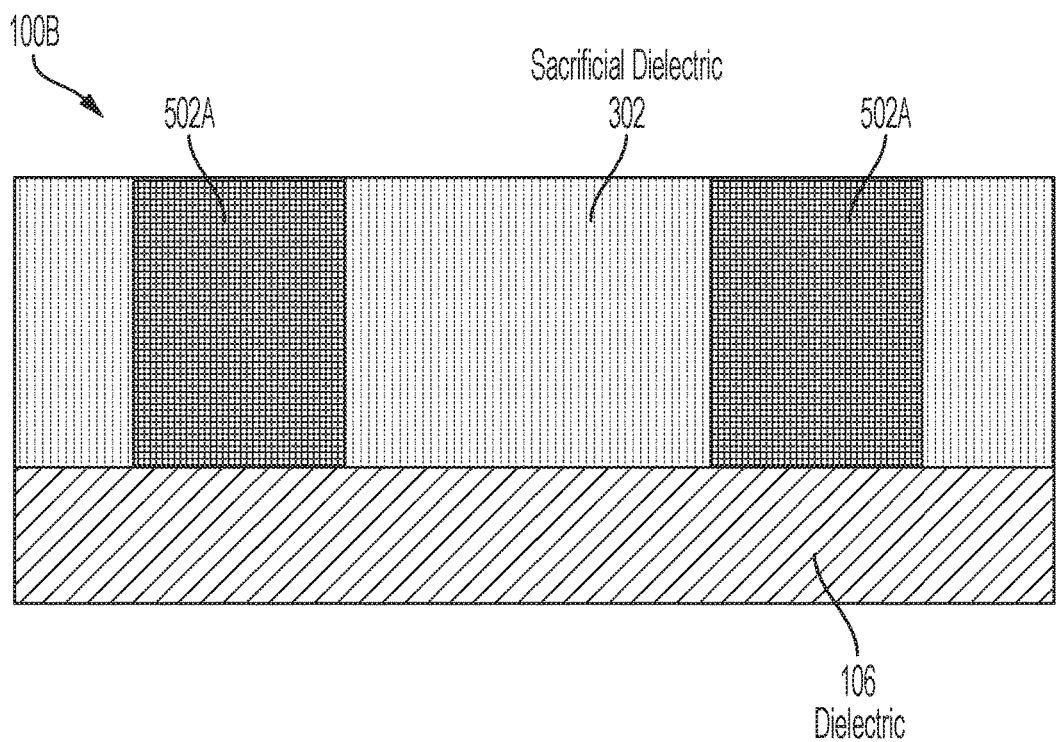

In FIG. 6, known semiconductor fabrication techniques have been used to remove excessive metal in the conductor layer 502 and planarize the top surface of the sacrificial dielectric 302 using a first planarization process such as a first CMP, thereby forming metal conductor regions 502A.

Figure 7:
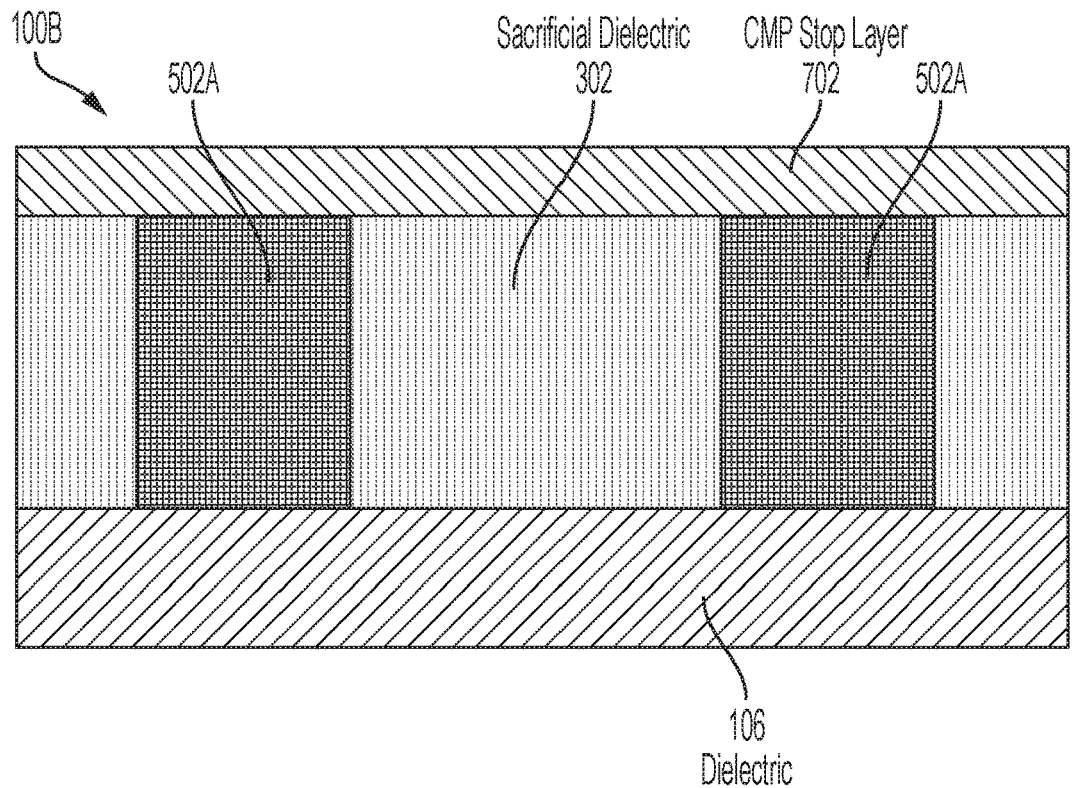

In FIG. 7, known semiconductor fabrication techniques (e.g., ALD) have been used to deposit a planarization stop layer 702 over the IC wafer 100B. In accordance with aspects of the invention, the planarization stop layer 702 will be used to form the planarization stop regions 160 (shown in FIGS. 1, 2A and 2B). In accordance with aspects of the invention, suitable materials for the layer of planarization stop layer 702 can include SiN, SiCN, SiC, and SiOCN.

Figure 8:
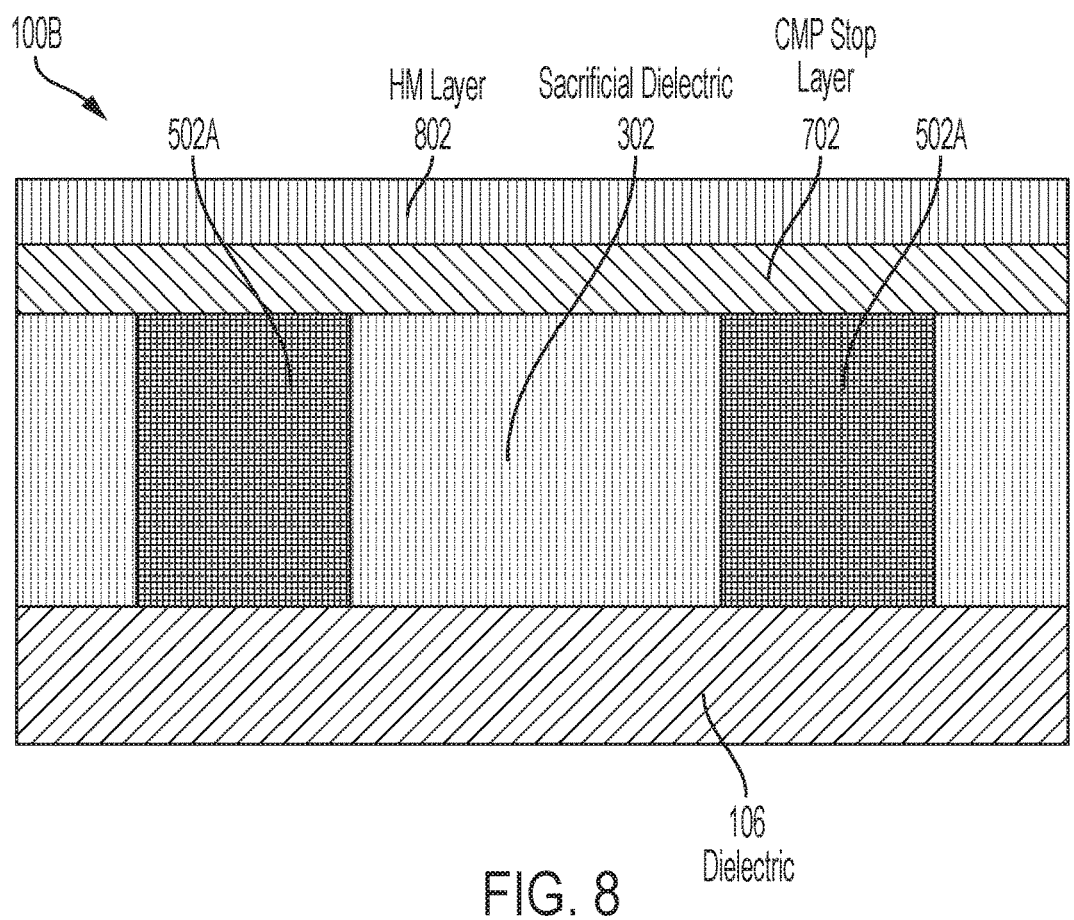

In FIG. 8, known semiconductor fabrication techniques (e.g., ALD) have been used to deposit a hard mask layer 802 over the planarization stop layer 702. In embodiments of the invention, the hard mask layer 802 can be any suitable hard mask material such as TiN and/or TaN.

Figure 9:
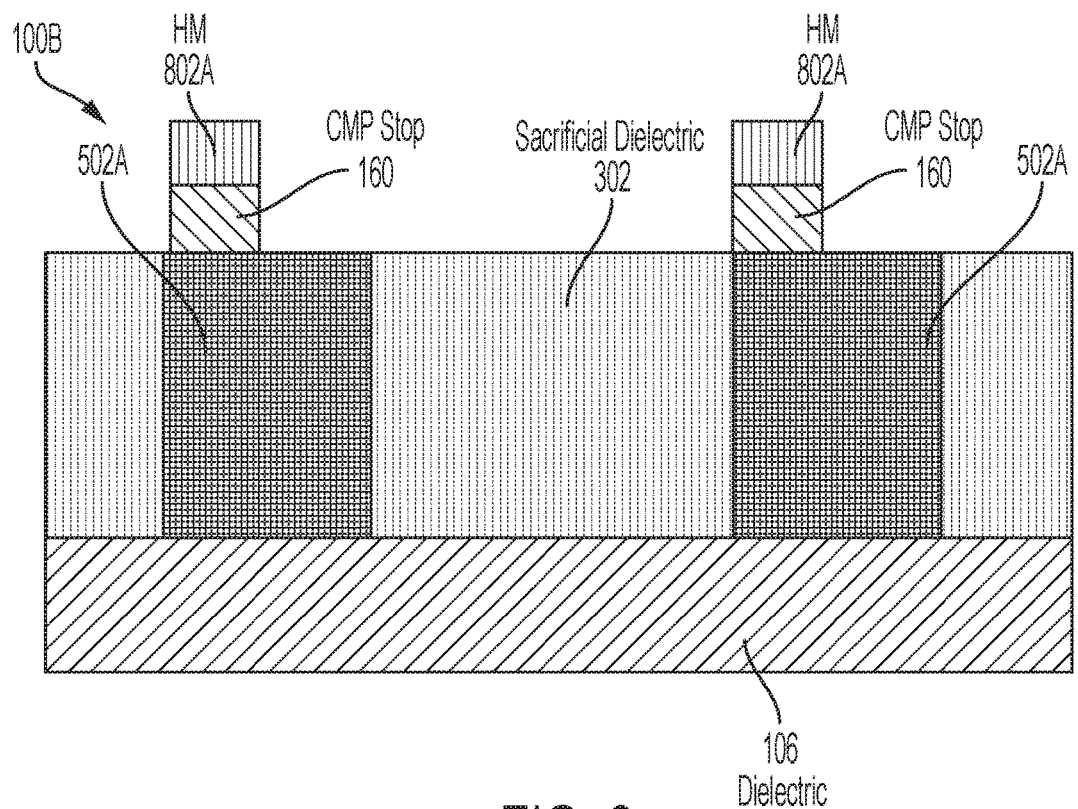

In FIG. 9, known semiconductor fabrication techniques have been used to pattern and etch (e.g., photolithography patterning and RIE) the hard mask layer 802 and the planarization stop layer 702 to form the hard masks 802A and the planarization stop regions 160. In accordance with aspects of the invention, the hard masks 802A and the planarization stop regions 160 are etched in a pattern that matches the footprint of the to-be-formed metal filled vias 140 (shown in FIG. 10).

Figure 10:
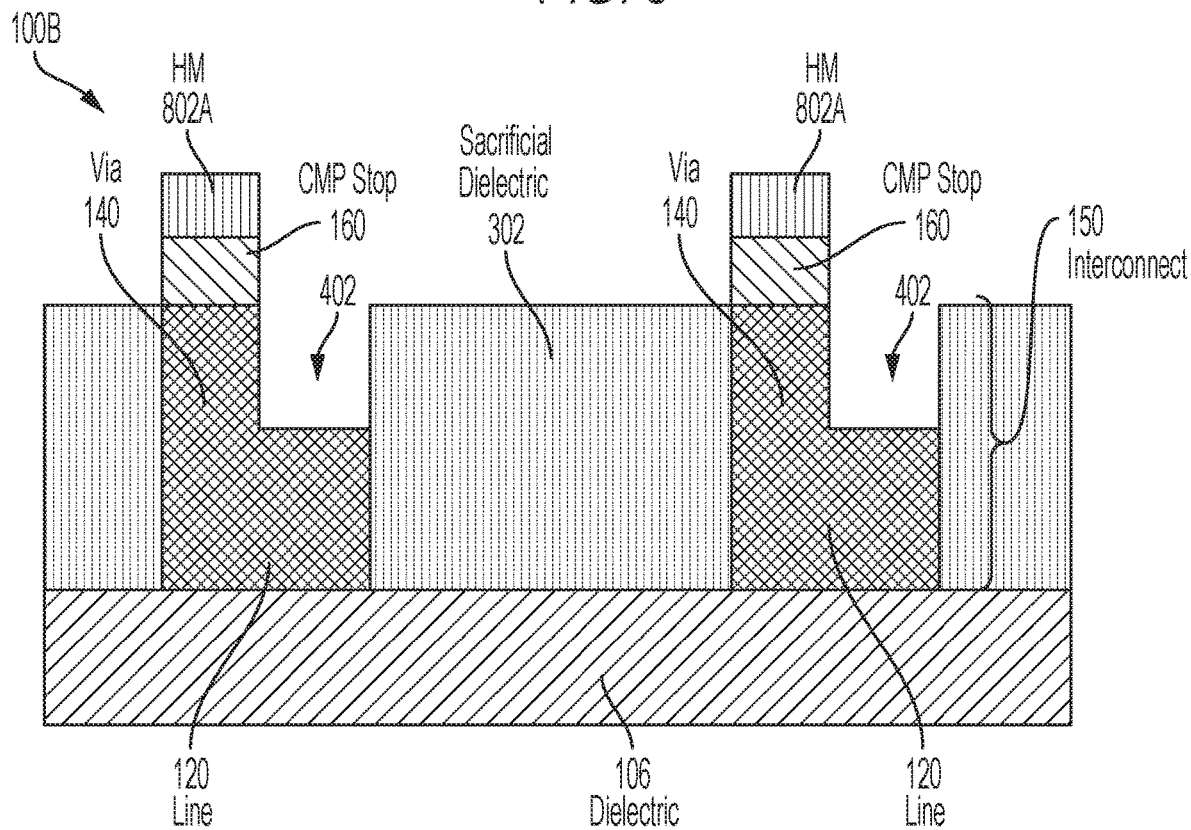

In FIG. 10, because the hard masks 802A and the planarization stop regions 160 were etched in patterns that match the footprints of the vias 140, the hard masks 802A and the planarization stop regions 160 can be used as masks for etching the exposed portions of the metal conductor regions 502A (shown in FIG. 9) to form the interconnect structures 150 having the lines 120 and the vias 140 in a top-via scheme/configuration. In accordance with embodiments of the invention, the exposed portions of the metal conductor regions 502A can be etched using a chemical etch selective to the metal used to form the metal conductor regions 502A. The metal-selective etch chemicals can be gaseous or wet solutions that are well known to those of ordinary skill in the art. In accordance with aspects of the invention, using the planarization stop regions 160 as masks for forming the metal-filled vias 140 results in the planarization stop regions 160 being fully self-aligned with the underlying vias 140. Accordingly, in embodiments of the invention that use the planarization stop regions 160 as masks for forming the metal-filled vias 140, the planarization stop surface area 160A (shown in FIG. 2B) is substantially the same as the via surface area 140A (shown in FIG. 2B).

In some aspects of the invention, the planarization stop region 160 can be formed such that it completely covers its underlying via 140. In some aspects of the invention, the planarization stop region 160 can be formed such that it completely covers its underlying via 140 and has a larger footprint that its underlying via. In some aspects of the invention, the planarization stop region 160 can be formed such that its footprint does not completely cover its underlying via 140. In some aspects of the invention, the planarization stop region 160 can be formed such that its footprint is substantially the same as the footprint of its underlying via 140. In accordance with aspects of the invention, the IPD of the top-via interconnect structures 150 is not above a threshold for allowing the interconnect structures 150 to generate a sufficiently strong endpoint signal to operate the endpoint detection system 180 (shown in FIG. 1).

Figure 11:
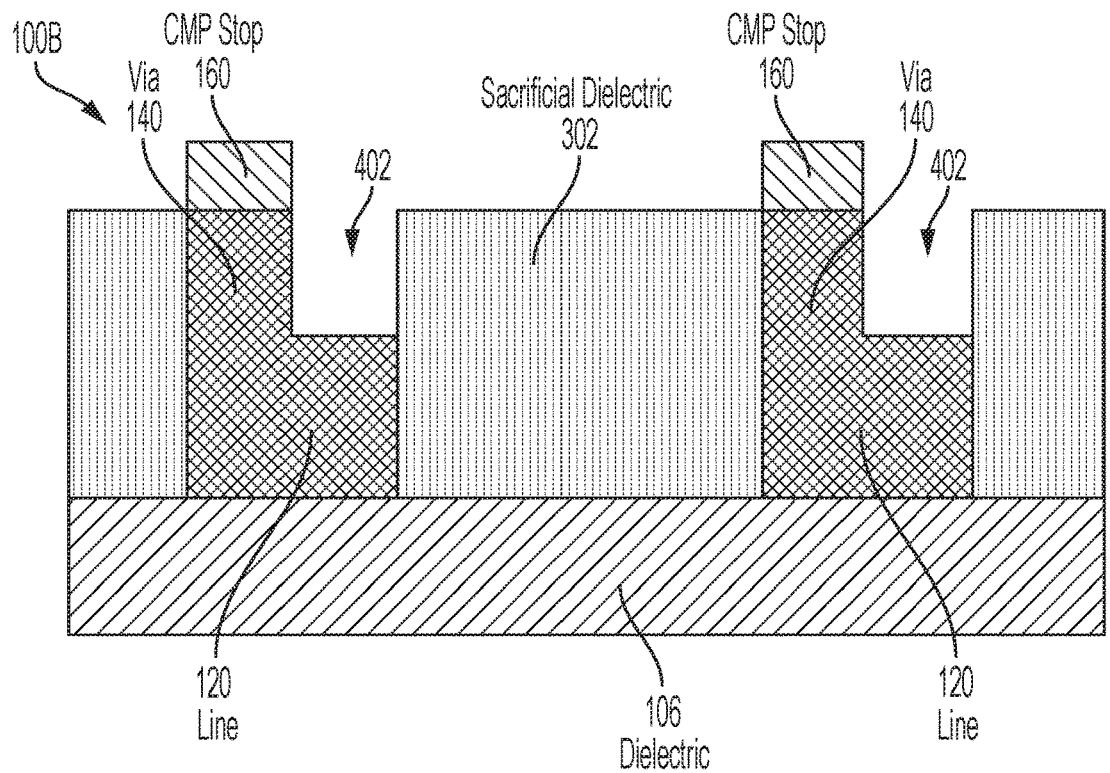

In FIG. 11, known semiconductor fabrication techniques have been used to remove the hard masks 802A.

Figure 12:
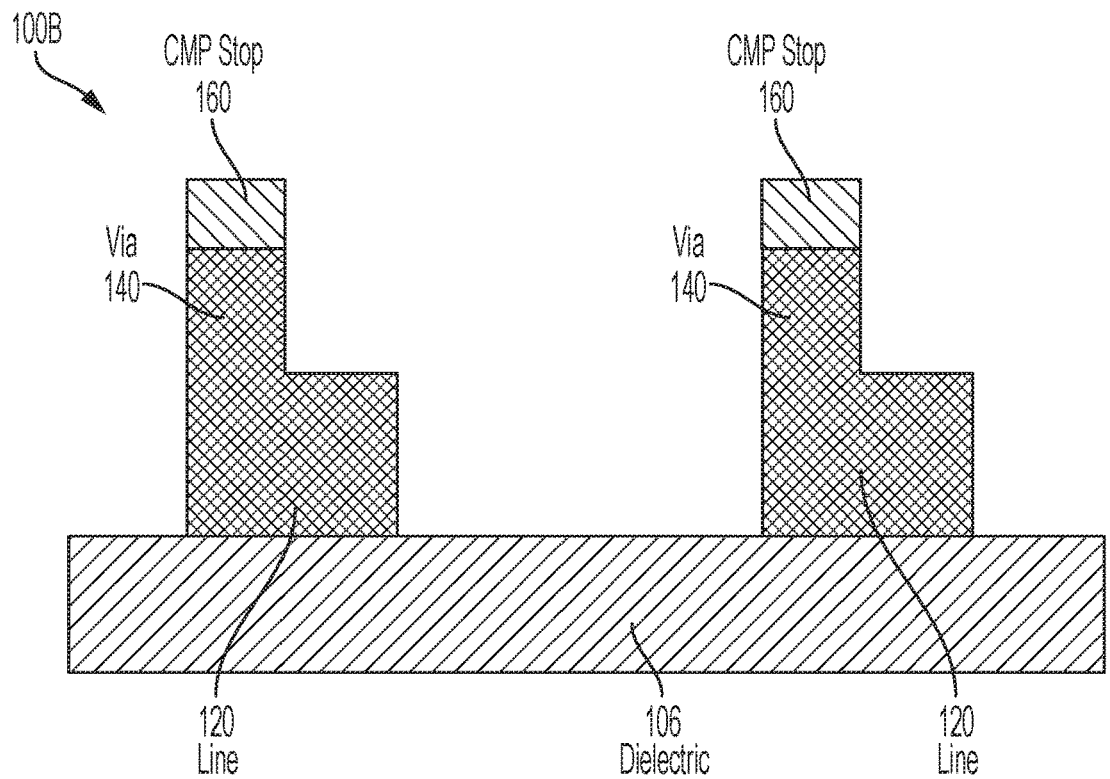

In FIG. 12, known fabrication techniques have been used to selectively remove the sacrificial dielectric layer 302 (shown in FIG. 11) from the IC wafer 100B.

Figure 13:
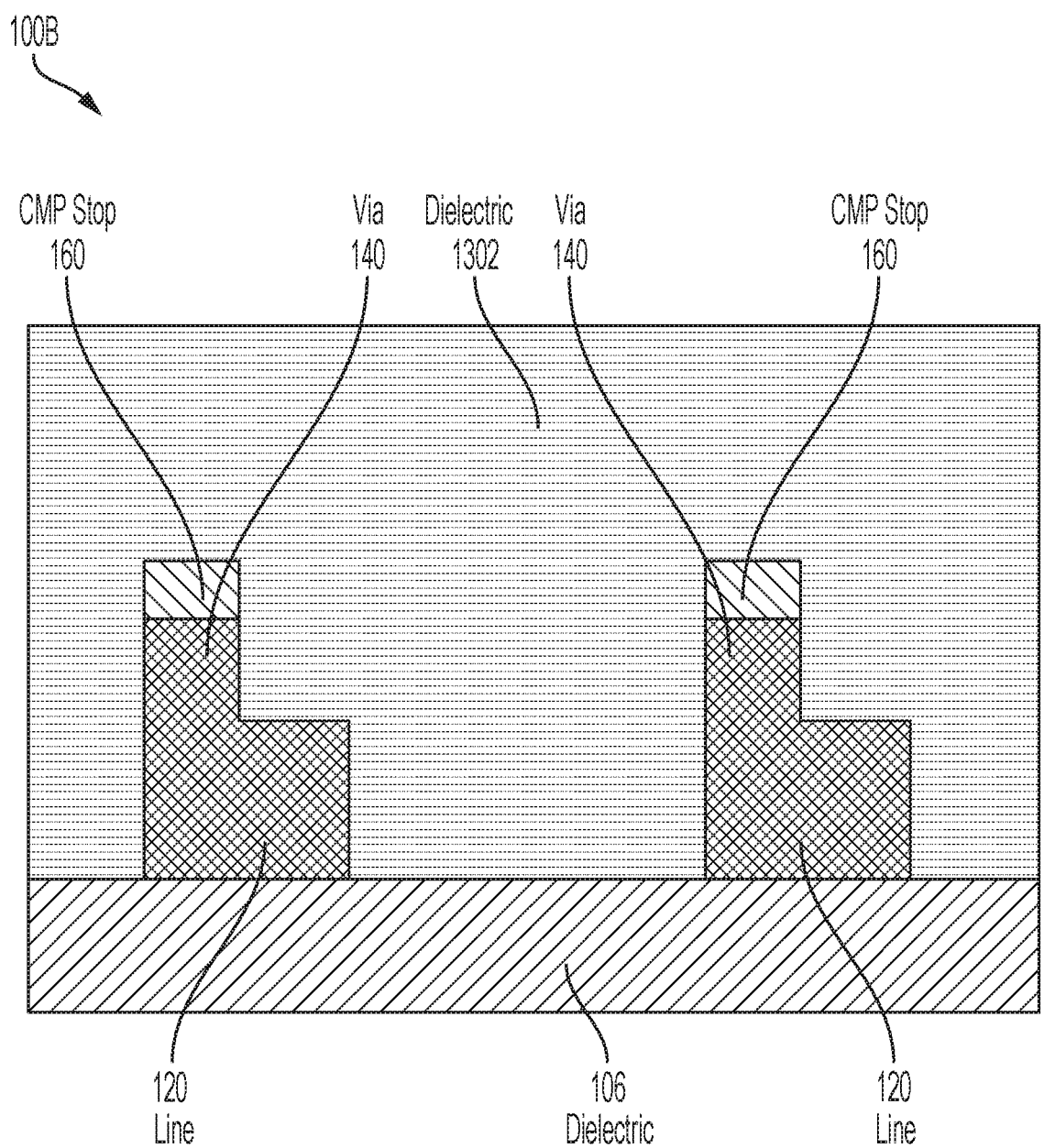

In FIG. 13, known semiconductor fabrication techniques (e.g., ALD) have been used to deposit a region of dielectric material 1302 over the interconnect structures 150 (shown in FIG. 10) and the dielectric layer 106. In accordance with aspects of the invention, the dielectric layer 1302 can be formed from a low-k and/or ULK dielectric material, which provide a parasitic resistance and capacitance (RC) level in the subsequently formed dielectric layer 108 (shown in FIG. 2A) that is sufficiently low to support high signal speed applications. In embodiments of the invention, suitable materials for the low-k/ULK materials of the BEOL layer can include, for example, fluorine-doped silicon dioxide, porous organosilicate glass material (e.g., SiCOH), porous silicon dioxide, and organic polymeric materials such as polyimide, polynorbornenes, benzocyclobutene, and hydrogen sisesquioxane, and the like.

In FIG. 2A, excess low-k (or ULK) material in the dielectric layer 1302 has been removed and the low-k dielectric layer 108 formed has been formed and planarized using a second CMP to form the planarized surface/window 108A (shown in FIGS. 1 and 2A).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

"Planarization" and "planarize" as used herein refer to a material removal process that employs at least mechanical forces, such as frictional media, to produce a substantially two-dimensional surface. A planarization process may include chemical mechanical polishing (CMP) or grinding. CMP is a material removal process that uses both chemical reactions and mechanical forces to remove material and planarize a surface.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a multi-layer integrated circuit (IC) structure, the method comprising:
   forming a substrate;
   forming a dielectric layer comprising a first dielectric material having an overburden comprising a first dielectric layer top surface positioned above the substrate;
   forming a top-via conductive interconnect in the dielectric layer, wherein the top-via conductive interconnect comprises a via and a line, wherein the via comprises a via top surface;
   forming a planarization stop region within the dielectric layer and over the via top surface, the planarization stop region comprising a planarization stop region surface that is substantially below the first dielectric layer top surface; and
   forming a second dielectric top surface that is substantially co-planar with respect to the planarization stop region surface by applying a planarization process to the overburden using an endpoint detection system;
   wherein the planarization stop region comprises a material having characteristics that generate an endpoint detection signal that is sufficiently strong to operate the endpoint detection system independently of an interconnect pattern density (IPD) of the first dielectric layer.

2. The method of claim 1, wherein the IPD is less than about 50%.

3. The method of claim 1, wherein the characteristics comprise hardness, modulus, and polish rate.

4. The method of claim 1, wherein:
   the via comprises a via width dimension;
   the line comprises a line width dimension;
   the via width dimension is less than the line width dimension; and
   an entirety of the via width dimension is above the line width dimension.

5. The method of claim 1, wherein forming the dielectric layer comprises depositing the first dielectric material into spaces that are not occupied by the top-via conductive interconnect and the planarization stop region.

6. The method of claim 1, wherein the planarization process comprises a chemical mechanical planarization (CMP) process.

7. The method of claim 6, wherein:
   the planarization stop region comprises a second dielectric material;
   the via comprises a via metal material;
   the CMP process includes the application of a CMP slurry to the first dielectric material overburden;
   the CMP slurry has a first level of selectivity to the overburden;
   the CMP slurry has a second level of selectivity to the planarization stop region;
   the CMP slurry has a third level of selectivity to the via metal material;
   the first level of selectivity is greater than the third level of selectivity; and
   the second level of selectivity is greater than the third level of selectivity.

8. The method of claim 1, wherein the planarization stop region comprises a second dielectric material.

9. The method of claim 8, wherein the second dielectric material is selected from a group consisting of SiN, SiCN, and SiC.

10. The method of claim 7, wherein the via metal material is selected from a group consisting of Cu, Co, and Ru.

* * * * *